United States Patent
Zhou et al.

[11] Patent Number: 6,156,598
[45] Date of Patent: Dec. 5, 2000

[54] METHOD FOR FORMING A LIGHTLY DOPED SOURCE AND DRAIN STRUCTURE USING AN L-SHAPED SPACER

[75] Inventors: Mei Sheng Zhou; Yelehanka Ramachandramurthy Pradeep; Jie Yu, all of Singapore, Singapore; Ying Keung Leung, Aberdeen, The Hong Kong Special Administrative Region of the People's Republic of China

[73] Assignee: Chartered Semiconductor Manufacturing Ltd., Singapore, Singapore

[21] Appl. No.: 09/460,113

[22] Filed: Dec. 13, 1999

[51] Int. Cl.⁷ .................................................. H01L 21/336
[52] U.S. Cl. ........................................... 438/231; 438/303
[58] Field of Search ........................ 438/303, FOR 188, 438/231

[56] References Cited

U.S. PATENT DOCUMENTS

| | | | |
|---|---|---|---|
| 4,908,326 | 3/1990 | Ma et al. ................................. | 437/44 |
| 5,234,850 | 8/1993 | Liao ......................................... | 437/44 |
| 5,501,997 | 3/1996 | Lin et al. .................................. | 437/43 |
| 5,541,132 | 7/1996 | Davies et al. . | |
| 5,679,589 | 10/1997 | Lee et al. . | |
| 5,770,508 | 6/1998 | Yeh et al. ................................. | 438/305 |
| 5,783,475 | 7/1998 | Ramaswami ............................ | 438/303 |
| 5,863,824 | 1/1999 | Gardner et al. ......................... | 438/303 |
| 6,020,242 | 2/2000 | Tsai et al. . | |

Primary Examiner—George Fourson
Assistant Examiner—Joannie A. Garcia
Attorney, Agent, or Firm—George O. Saile; Rosemary L. S. Pike; William J. Stoffel

[57] ABSTRACT

A method for forming an L-shaped spacer using a sacrificial organic top coating, then using the L-shaped spacer to simultaneously implant lightly doped source and drain extensions through the L-shaped spacer while implanting source and drain regions beyond the L-shaped spacer. A semiconductor structure is provided having a gate structure thereon. A liner oxide layer is formed on the gate structure. A dielectric spacer layer is formed on the liner oxide layer. In the preferred embodiments, the dielectric spacer layer comprises a silicon nitride layer or a silicon oxynitride layer. A sacrificial organic layer is formed on the dielectric spacer layer. The sacrificial organic layer and the dielectric spacer layer are anisotropically etched to form spacers comprising a triangle-shaped sacrificial organic structure and an L-shaped dielectric spacer. The triangle-shaped sacrificial organic structure is removed leaving an L-shaped dielectric spacer. Impurity ions are implanted into the surface of the semiconductor structure forming lightly doped source and drain extensions where the ions are implanted through the L-shaped spacer, and forming source and drain regions beyond the L-shaped spacer where the ions are implanted without passing through the L-shaped spacer.

15 Claims, 2 Drawing Sheets

METHOD FOR FORMING A LIGHTLY DOPED SOURCE AND DRAIN STRUCTURE USING AN L-SHAPED SPACER

BACKGROUND OF INVENTION

1) Field of the Invention

This invention relates generally to fabrication of a semiconductor device and more particularly to a method for forming a lightly doped source and drain (LDD) structure using an L-shaped spacer.

2) Description of the Prior Art

As semiconductor technology continues to advance, the physical geometry of semiconductor devices continually shrinks and the fabrication processes for forming semiconductor devices continually becomes more complex, significantly increasing manufacturing cost and cycle time. The number of masking and ion implant steps is an important factor in the manufacturing cost and cycle time of semiconductor fabrication.

Conventional CMOS fabrication processes require four masking steps and four ion implant steps to form source and drain regions with source and drain extensions (LDDs) that meet the performance requirements for modern CMOS devices. Following gate definition in a typical CMOS process, a PLDD (P-type lightly doped source and drain, P-type source and drain extension) mask is formed of photoresist, covering the area for the N-type transistor. P-type ions are implanted through the PLDD mask for the P-type source and drain extensions (PLDD), and the PLDD mask is removed. An NLDD (N-type lightly doped source and drain, N-type source and drain extension) mask is formed of photoresist, covering the area for the P-type transistor. N-type ions are implanted through the NLDD for the N-type source and drain extensions (NLDD), and the NLDD mask is removed. After sidewall spacers are formed on the P-type gate and on the N-type gate, a P+ source and drain (P-type heavily doped source and drain) implant mask is formed over the area for the N-type transistor. A heavy dose of P-type ions are implanted through the P+ source and drain implant mask, and the P+ source and drain implant mask is removed. N+ source and drain (N-type heavily doped source and drain) implant mask is formed over the area for the P-type transistor. A heavy dose of N-type ions are implanted through the N+ source and drain implant mask, and the N+ source and drain implant mask is removed. A need exists for a process for forming source and drain regions and source and drain extensions with a reduced number of masking steps and ion implant steps.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 4,908,326 (Ma et al.), U.S. Pat. No. 5,783,475 (Ramaswami), and U.S. Pat. No. 5,863,824 (Gardner et al.) show L-shaped spacers and separate ion implant processes for the source and drain extensions (eg lightly doped source and drain, LDD) and the source and drain (eg source and drain regions, junction regions).

U.S. Pat. No. 5,501,997 (Lin et al.) shows an ion implant process which produces a lightly doped region where a sidewall spacer patially blocks the implant and a heavily doped region where the spacer does not overlie the substrate. However, the single layer spacer does not provide the thickness control that would be required for source and drain extensions.

U.S. Pat. No. 5,234,850 (Liao) shows an L-shaped spacer with nitride and separate LDD and source and drain implants.

U.S. Pat. No. 5,770,508 (Yeh et al.) shows a process for forming an L-shaped spacer using an oxide layer and an overlying nitride layer, anisotropically etching to form spacers, then removing the nitride layer, leaving an L-shaped oxide spacer. Ions are implanted through the L-shaped spacer to form shallow source and drain extensions under the L-shaped spacer and moderate-depth source and drain extensions beyond the L-shaped spacer. However, the silicon nitride top layer etch does not provide the thickness control required to simultaneously form source and drain extensions and source and drain junction regions.

SUMMARY OF THE INVENTION

It is an object of the present invention to provide a method for forming an L-shaped spacer using an organic top coating and to implant lightly doped source and drain extensions through the L-shaped spacer simultaneously with the (heavily doped) source and drain (junction region) implant.

It is another object of the present invention to provide a method for source and drain regions and lightly doped source and drain extensions with a reduced number of ion implant steps.

It is yet another object of the present invention to provide an economical method for forming source and drain regions and lightly doped source and drain extensions with a reduced cycle time.

To accomplish the above objectives, the present invention provides a method for forming an L-shaped spacer using a sacrificial organic top coating, and simultaneously implanting lightly doped source and drain extensions through the L-shaped spacer, and implanting (heavily doped) source and drain regions beyond the L-shaped spacer. A semiconductor structure is provided having a gate structure thereon. A liner oxide layer is formed on the gate structure. A dielectric spacer layer is formed on the liner oxide layer. In the preferred embodiments, the dielectric spacer layer comprises a silicon nitride layer or a silicon oxynitride layer. A sacrificial organic layer is formed on the dielectric spacer layer. The sacrificial organic layer and the dielectric spacer layer are anisotropically etched to form spacers comprising a triangle-shaped sacrificial organic structure and an L-shaped dielectric spacer. The liner oxide layer can act as an etch stop for the anisotropic etch process. The triangle-shaped sacrificial organic structure is removed using an etch selective to the L-shaped dielectric spacer, leaving an L-shaped dielectric spacer. Impurity ions are implanted through the L-shaped spacer to form source and drain extensions simultaneosly with the source and drain (junction region) implant.

The present invention provides considerable improvement over the prior art. A lightly doped source and drain extension and a (heavily doped) source and drain region can be formed simultaneously using one implant mask and one ion implant step. A CMOS process can be performed using one P-type implant mask and ion implant step and one N-type implant mask and ion implant step, instead of four inplant masks and four implant steps.

The key to forming a lightly doped source and drain extension and a (heavily doped) source and drain region simultaneously is an L-shaped spacer whose thickness can be repeatably controlled. Because the sacrificial organic structure can be completely removed using a selective etch, without damaging the resulting L-shaped dielectric spacers, the thickness of the L-shaped spacer is very repeatable. Also, the spacer which results from the process of the present invention is less susceptible to post-etch wet chemical processing than an oxide layer, resulting in a more uniform spacers, both across the IC and between IC's.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. A preferred embodiment of the present invention is described with reference to FIGS. 1 through 5. The preferred embodiment provides a method for forming an L-shaped spacer using an organic top coating and simultaneouslt implanting ions for a lightly doped source and drain extension through the L-shaped spacer and implanting ions for a (heavily doped) source and drain region beyond the L-shaped spacer. The present invention provides a consistently controllable opening which is adequate for good gap-filling characteristics. Also, the organic top coat can be formed faster than an oxide layer using a lower thermal budget.

Figure 1:
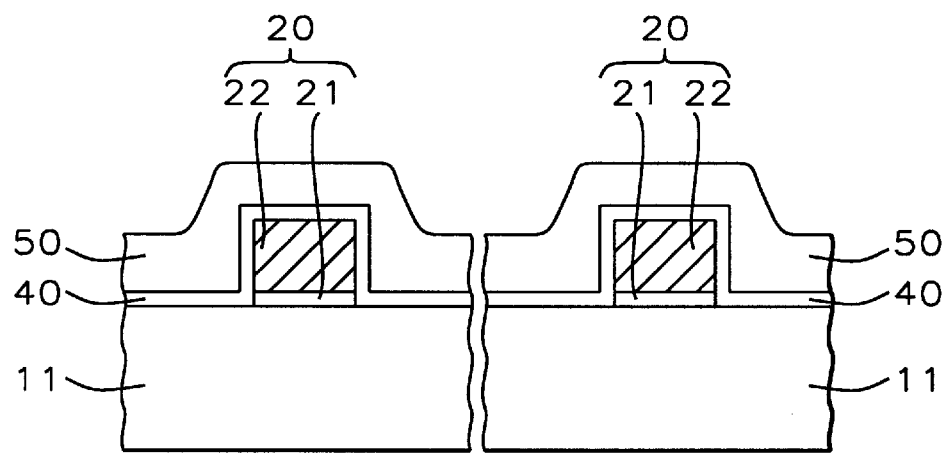
FIGS. 1 through 5 illustrate sequential sectional views of a method for forming L-shaped spacers using a sacrificial organic top coat, and simultaneously implanting ions for a lightly doped source and drain extension and a (heavily doped) source and drain region according to the present invention.

Referring to FIG. 1, the preferred embodiment of the present invention begins by providing a semiconductor structure (11). Semiconductor substrate (11) is understood to possibly include a substrate comprising a wafer of semiconductor material such as silicon or germanium or a like substrate structure such as silicon-on-insulator (SOI) as is known in the art. Semiconductor structure (11) should be understood to possibly further include one or more conductive and/or insulating layers and passive and/or active devices formed on or over said substrate. The semiconductor structure (11) has one or more gate structures (20) thereon. The gate structure (20) typically comprises a gate dielectric layer (21) and a gate electrode (22) as is known in the art. The gate electrode (22) typically comprises doped polysilicon.

Still referring to FIG. 1, a dielectric spacer layer (40) is formed over the gate structure (20). The dielectric spacer layer (40) can comprise silicon dioxide, or more preferably a silicon nitride layer or a silicon oxynitride. The dielectric layer can be formed using a chemical vapor deposition process, a plasma enhanced chemical vapor deposition process, or a JET CVD process and preferably has a thickness of between about 100 Angstroms and 500 Angstroms.

If the dielectric spacer layer (40) comprises a silicon nitride layer, a liner oxide layer (not shown) can be formed on the gate structure (20), prior to forming the dielectric spacer layer (40). The liner oxide layer can be composed of silicon dioxide thermally grown or deposited (using chemical vapor deposition or plasma enhanced chemical vapor deposition) to a thickness of between about 50 Angstroms and 200 Angstroms. The liner oxide layer (30) is important to prevent outdiffusion of dopant ions from the gate electrode and also to provide an etch stop for a subsequent silicon nitride etch.

Referring again to FIG. 1, a sacrificial organic layer (50) is formed on the dielectric spacer layer (40). The sacrificial organic layer (50) is preferably composed of a semi-conformal organic material such as propylene glycol monomrthyl ether. The sacrificial organic layer (50) can be formed using spin coating, and preferably has a thickness of between about 300 Angstroms and 1000 Angstroms.

Figure 2:
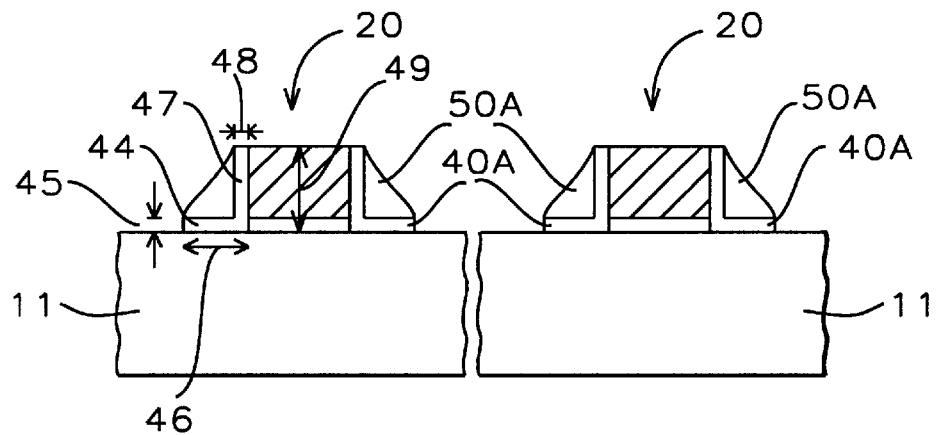

Referring to FIG. 2, the sacrificial organic layer (50) and the dielectric spacer layer (40) are anisotropically etched to form spacers comprising a triangle-shaped sacrificial organic structure (50A) and an L-shaped dielectric spacer (40A). The anisotropic etch is preferably performed using a plasma etch process with a $CF_4/HBr/O_2$ or $Cl_2/O_2$ chemistry for the organic layer (50) and a $SF_6/HBr$ or $CF_4/HBr$ chemistry for the dielectric spacer layer (40). The liner oxide layer (30) can act as an etch stop for the dielectric spacer layer etch. The triangle-shaped sacrificial organic structure (50A) preferably has a thickness of between about 200 Angstroms and 900 Angstroms at its base and a height dependent upon the height of the electrode (typically between about 1000 Angstroms and 3000 Angstroms). The L-shaped dielectric spacer (40A) has a horizontal leg (44) and a vertical leg (47). The horizontal leg (44) preferably has a thickness (45) of between about 100 Angstroms and 500 Angstroms and a width (46) of between about 200 Angstroms and 900 Angstroms. The vertical leg (47) preferably has a thickness (48) of between about 100 Angstroms and 500 Angstroms and a height (49) dependant upon the height of the electrode.

Figure 3:
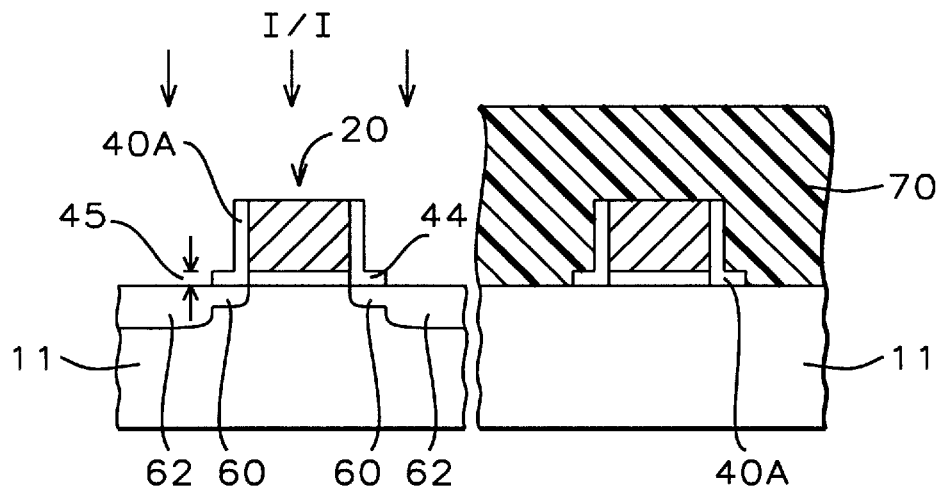

Referring to FIG. 3, the triangle-shaped sacrificial organic structure (50A) is removed leaving an L-shaped dielectric spacer (40A). The triangle-shaped sacrificial organic structure (50A) is preferably removed using an etch selective to the dielectric spacer layer such as an $O_2$ plasma stripping process. The etch preferably has a selectivity to the dielectric spacer layer of 100:1 or greater.

A key advantage of the present invention is that the thickness (45) of the horizontal leg (44) of the L-shaped dielectric spacer (40A) can be precisely and repeatably controlled. For example, the process of the present invention can provide an L-shaped dielectric spacer (40A) with a horizontal leg (44) having a thickness (45) of about 300 Angstroms with a 3-sigma variability of less than 20 Angstroms.

Still referring to FIG. 3, impurity ions are implanted into the surface of the semiconductor structure (11) for both the lightly doped source and drain extensions and the (heavily doped) source and drain regions. For example, for an N-type gate with an L-shaped spacer having a horizontal leg (44) with a thickness (45) of between about 100 Angstroms and 500 Angstroms, arsenic or antimony ions can be implanted at an energy of between about 30 KeV and 70 KeV and a dose of between about 1E15 $atm/cm^2$ and 5E15 $atm/cm^2$.

The ions are driven in at a temperature of between about 950° C. and 1100° C. for a time of between about 0 seconds and 60 seconds. Adjacent to the gate structure (20), where the ions must pass through the horizontal leg (44) of the L-shaped dielectric spacer (40A) prior to entering the semiconductor structure (11), the As/Sb ions penetrate to a depth of between about 300 Angstroms and 800 Angstroms at a concentration of between about 1E18 atm/cm$^3$ and 1E20 atm/cm$^3$, forming N-type lightly doped source and drain extensions (60). Beyond the horizontal leg (44) of the L-shaped dielectric spacer (40A), where the ions enter the surface of the semiconductor structure without passing through the L-shaped spacer (40A), the As/Sb ions penetrate to a depth of between about 800 Angstroms and 1500 Angstroms at a concentration of between about 1E20 atm/cm$^3$ and 1E21 atm/cm$^3$, forming N-type (heavily doped) source and drain regions (66).

For devices having both N-type gates and P-type gates, such as CMOS devices, a first photoresist mask (70) is formed over the area where the P-type gate structure is to be formed prior to implanting N-type ions. Following the ion implant, the first photoresist mask (70) is removed.

Figure 4:
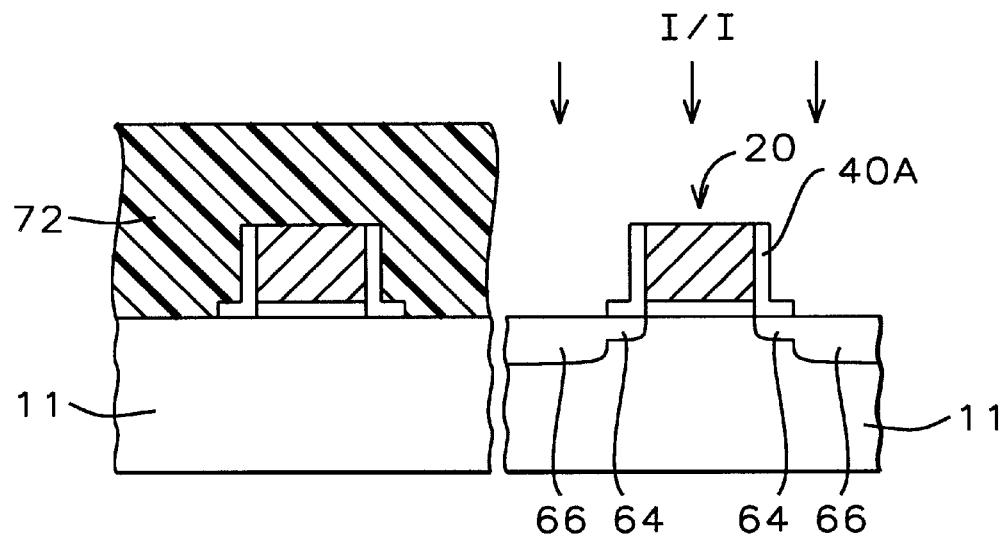

Referring to FIG. 4, for devices having both N-type gates and P-type gates, a second photoresist mask (72) is formed over the N-type gate after forming the N-type lightly doped source and drain extensions (60) and the N-type (heavily doped) source and drain regions (62). For a P-type gate with an L-shaped spacer having a horizontal leg (44) with a thickness (45) of between about 100 Angstroms and 500 Angstroms, boron ions can be implanted at an energy of between about 2 KeV and 10 KeV and a dose of between about 1E15 atm/cm$^2$ and 5E15 atm/cm$^2$. The ions are driven in at a temperature of between about 950° C. and 1100° C. for a time of between about 0 seconds and 30 seconds. Adjacent to the gate structure (20), where the ions must pass through the horizontal leg (44) of the L-shaped dielectric spacer (40A) prior to entering the semiconductor structure (11), the B ions penetrate to a depth of between about 300 Angstroms and 800 Angstroms at a concentration of between about 1E18 atm/cm$^3$ and 1E20 atm/cm$^3$, forming P-type lightly doped source and drain extensions (64). Beyond the horizontal leg (44) of the L-shaped dielectric spacer (40A), where the ions enter the surface of the semiconductor structure without passing through the L-shaped spacer (40A), the B ions penetrate to a depth of between about 800 Angstroms and 1500 Angstroms at a concentration of between about 1E20 atm/cm$^3$ and 1E21 atm/cm$^3$, forming P-type (heavily doped) source and drain regions (66).

Figure 5:
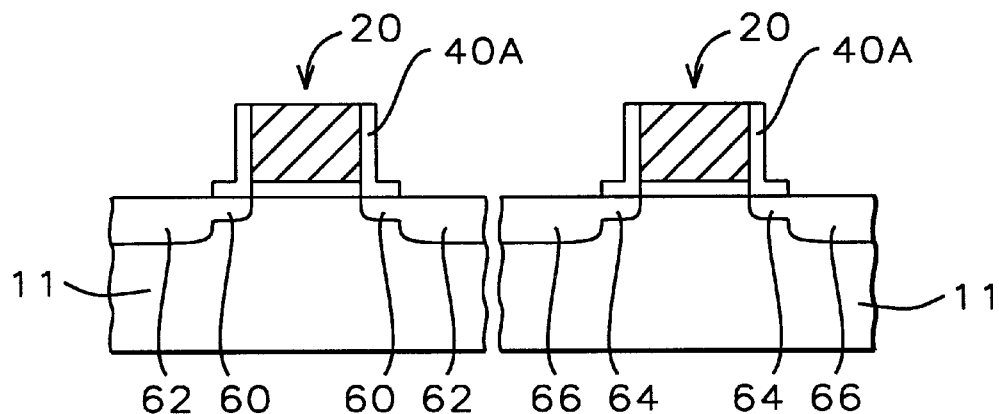

Referring to FIG. 5, the second photoresist mask (72) is removed. The device can then be completed using processes known in the art. The ion drive in step can be performed once to drive in both ion species following both ion implants, instead of performing separate ion drive in steps.

The key advantages of the present invention are that lightly doped source and drain regions and (heavily doped) source and drain regions can be formed simultaneously, thereby requiring just one implant mask and just one implant step to form each type (N or P) of gate. The invention thereby reduces fabrication cost and cycle time.

While the invention has been particularly shown and described with reference to the preferred embodiments thereof, it will be understood by those skilled in the art that various changes in form and details may be made without departing from the spirit and scope of the invention.

What is claimed is:

1. A method for forming a lightly doped source and drain structure and source and drain regions using an L-shaped spacer, comprising the steps of:
   a. providing a semiconductor structure having a gate structure thereon;
   b. forming an L-shaped dielectric spacer; said L-shaped dielectric spacer having a horizontal leg with a thickness of between about 100 Angstroms and 500 Angstroms with a 3-sigma variability of less than 20 Angstroms; and
   c. implanting impurity ions into the surface of said semiconductor structure; whereby lightly doped source and drain extensions are formed by ions implanted through said horizontal leg of said L-shaped spacer, and source and drain regions are formed by ions implanted into the surface of said semiconductor structure not covered by said L-shaped spacer.

2. The method of claim 1 wherein said L-shaped dielectric spacer comprises a silicon nitride or silicon oxynitride having a thickness of between about 100 Angstroms and 500 Angstroms.

3. The method of claim 1 wherein said lightly doped source and drain extensions and said source and drain regions are P-type lightly doped source and drain extensions and P-type source and drain regions formed by implanting boron ions at an energy of between about 2 KeV and 10 KeV and at a dose of between about 1E15 atm/cm$^2$ and 5E15 atm/cm$^2$.

4. The method of claim 2 wherein said lightly doped source and drain extensions and said source and drain regions are P-type lightly doped source and drain extensions and P-type source and drain regions formed by implanting boron ions at an energy of between about 2 KeV and 10 KeV and at a dose of between about 1E15 atm/cm$^2$ and 5E15 atm/cm$^2$.

5. The method of claim 1 wherein said lightly doped source and drain extensions and said source and drain regions are N-type lightly doped source and drain extensions and N-type source and drain regions formed by implanting arsenic or antimony ions at an energy of between about 30 KeV and 70 KeV and at a dose of between about 1E15 atm/cm$^2$ and 5E15 atm/cm$^2$.

6. The method of claim 2 wherein said lightly doped source and drain extensions and said source and drain regions are N-type lightly doped source and drain extensions and N-type source and drain regions formed by implanting arsenic or antimony ions at an energy of between about 30 KeV and 70 KeV and at a dose of between about 1E15 atm/cm$^2$ and 5E15atm/cm$^2$.

7. The method of claim 3 wherein said P-type lightly doped source and drain extension has a concentration of boron ions of between about 1E18 atm/cm$^3$ and 1E20 atm/cm$^3$ and a depth of between about 300 Angstroms and 800 Angstroms and said P-type source and drain region has a concentration of boron ions of between about 1E20 atm/cm$^3$ and 1E21 atm/cm$^3$ and a depth of between about 800 Angstroms and 1500 Angstroms.

8. The method of claim 5 wherein said N-type lightly doped source and drain extension has a concentration of arsenic or antimony ions of between about 1E18 atm/cm$^3$ and 1E20 atm/cm$^3$ and a depth of between about 300 Angstroms and 800 Angstroms and said N-type source and drain region has a concentration of arsenic or antimony ions of between about 1E20 atm/cm$^3$ and 1E21 atm/cm$^3$ and a depth of between about 800 Angstroms and 1500 Angstroms.

9. A method form forming lightly doped source and drain extensions for a CMOS device using L-shaped spacers, comprising the steps of:
   a. providing a semiconductor structure having a P-type gate structure and an N-type gate structure thereon;
   b. forming a liner oxide layer on said gate structures;
   c. forming a dielectric spacer layer on said liner oxide layer;
   d. forming a sacrificial organic layer on said dielectric spacer layer;
   e. anisotropically etching said sacrificial organic layer and said dielectric spacer layer to form spacers comprising a triangle-shaped sacrificial organic structure and an L-shaped dielectric spacer;
   f. removing said triangle-shaped sacrificial organic structure;
   g. forming a first photoresist mask over said P-type gate;
   h. implanting N-type impurity ions into the surface of said semiconductor structure; whereby N-type lightly doped source and drain extensions are formed by ions implanted through said horizontal leg of said L-shaped spacer, and N-type source and drain regions are formed by ions implanted into the surface of said semiconductor structure not covered by said L-shaped spacer;
   i. removing said first photoresist mask and forming a second photoresist mask over said N-type gate;
   j. implanting P-type impurity ions into the surface of said semiconductor structure; whereby P-type lightly doped source and drain extensions are formed by ions implanted through said horizontal leg of said L-shaped spacer, and P-type source and drain regions are formed by ions implanted into the surface of said semiconductor structure not covered by said L-shaped spacer; and
   k. removing said second photoresist mask.

10. The method of claim 9 wherein the 3-sigma variability of said thickness of said horizontal leg of said L-shaped spacers is less than 20 Angstroms.

11. The method of claim 9 wherein said L-shaped dielectric spacers comprise a silicon nitride layer or a silicon oxynitirde layer having a thickness of between about 100 Angstroms and 500 Angstroms.

12. The method of claim 9 wherein said P-type lightly doped source and drain extensions and said P-type source and drain regions are formed by implanting boron ions at an energy of between about 2 KeV and 10 KeV and at a dose of between about 1E15 atm/cm$^2$ and 5E15 atm/cm$^2$, and said N-type lightly doped source and drain extensions and said N-type source and drain regions are formed by implanting arsenic or antimony ions at an energy of between about 30 KeV and 70 KeV and at a dose of between about 1E15 atm/cm$^2$ and 5E15 atm/cm$^2$.

13. The method of claim 9 wherein said P-type lightly doped source and drain extensions have a concentration of boron ions of between about 1E18 atm/cm$^3$ and 1E20 atm/cm$^3$ and a depth of between about 300 Angstroms and 800 Angstroms; said P-type source and drain regions have a concentration of boron ions of between about 1E20 atm/cm$^3$ and 1E21 atm/cm$^3$ and a depth of between about 800 Angstroms and 1500 Angstroms; said N-type lightly doped source and drain extensions have a concentration of arsenic or antimony ions of between about 1E18 atm/cm$^3$ and 1E20 atm/cm$^3$ and a depth of between about 300 Angstroms and 800 Angstroms; and said N-type source and drain regions have a concentration of arsenic or antimony ions of between about 1E20 atm/cm$^3$ and 1E21 atm/cm$^3$ and a depth of between about 800 Angstroms and 1500 Angstroms.

14. A method form forming lightly doped source and drain extensions using L-shaped spacers, comprising the steps of:
   a. providing a semiconductor structure having a gate structure thereon;
   b. forming a liner oxide layer on said gate structures;
   c. forming a dielectric spacer layer on said liner oxide layer;
   d. forming a sacrificial organic layer on said dielectric spacer layer;
   e. anisotropically etching said sacrificial organic layer and said dielectric spacer layer to form spacers comprising a triangle-shaped sacrificial organic structure and an L-shaped dielectric spacer;
   f. removing said triangle-shaped sacrificial organic structure; and
   g. implanting impurity ions into the surface of said semiconductor structure forming lightly doped source and drain extensions where said impurity ions are implanted through said horizontal leg of said L-shaped spacer, and forming source and drain regions where said impurity ions are implanted into the surface of said semiconductor structure not covered by said L-shaped spacer.

15. The method of claim 14 wherein said L-shaped dielectric spacer having a horizontal leg with a thickness of between about 100 Angstroms and 500 Angstroms with a 3-sigma variability of less than 20 Angstroms.

* * * * *